(12) United States Patent
Pan

(10) Patent No.: US 7,359,217 B2
(45) Date of Patent: Apr. 15, 2008

(54) PIVOTING APPARATUS WITH A SHIELDING FUNCTION

(75) Inventor: Long-Jyh Pan, Shijr (TW)

(73) Assignee: Qisda Corporation, Taoyuan (TW)

( * ) Notice: Subject to any disclaimer, the term of this patent is extended or adjusted under 35 U.S.C. 154(b) by 116 days.

(21) Appl. No.: 11/091,447

(22) Filed: Mar. 29, 2005

(65) Prior Publication Data
US 2005/0213307 A1  Sep. 29, 2005

(30) Foreign Application Priority Data
Mar. 29, 2004  (TW) ............... 93108564 A

(51) Int. Cl.
*H04B 1/03* (2006.01)
*H05K 5/02* (2006.01)

(52) U.S. Cl. ............ 361/814; 361/736; 361/752

(58) Field of Classification Search ........ 361/736–737, 361/814; 455/550.1
See application file for complete search history.

(56) References Cited

U.S. PATENT DOCUMENTS

| | | | | |
|---|---|---|---|---|
| 4,641,398 A * | 2/1987 | Schick | .............. | 24/33 R |
| 5,681,176 A * | 10/1997 | Ibaraki et al. | ............... | 439/165 |
| 5,832,080 A * | 11/1998 | Beutler et al. | ......... | 379/433.13 |
| 6,270,091 B1 * | 8/2001 | Smith | ....................... | 280/14.21 |
| 6,547,575 B2 * | 4/2003 | Kato et al. | .................. | 439/165 |
| 6,650,547 B2 * | 11/2003 | Hemmi et al. | .............. | 361/755 |
| 6,754,507 B2 * | 6/2004 | Takagi | ..................... | 455/550.1 |

\* cited by examiner

*Primary Examiner*—Tuan T. Dinh
(74) *Attorney, Agent, or Firm*—Rabin & Berdo, PC

(57) ABSTRACT

A pivoting apparatus with a shielding function rotatably connects a main body and a folder of a foldable device. The pivoting apparatus includes a flexible printed circuit board (FPCB), a first metal sleeve, and a second metal sleeve. The first metal sleeve is disposed around the FPCB for fixing the first end of FPCB on the main body. The second metal sleeve is disposed around the FPCB for fixing the second end of FPCB on the folder. The first and second metal sleeves are rotatably connected for receiving the FPCB. When the folder is rotated relatively to the main body, the second metal sleeve twists the second end of FPCB relative to the first end of FPCB.

22 Claims, 3 Drawing Sheets

PIVOTING APPARATUS WITH A SHIELDING FUNCTION

This application claims the benefit of Taiwan Application Serial No. 093108564, filed Mar. 29, 2004, the subject matter of which is incorporated herein by reference.

BACKGROUND OF THE INVENTION

1. Field of the Invention

The invention relates in general to a pivoting apparatus, and more particularly to a pivoting apparatus with a shielding function.

2. Description of the Related Art

In recent years, with the rapid development in electronic and information technology, there has been an increase demand in the marketplace for portable electronic devices. Take a foldable mobile phone for example. In the foldable mobile phone, the main body and the folder are coupled via the pivoting apparatus. A flexible printed circuit board (FPCB) is disposed in the pivoting apparatus, and connecting the two different printed circuit boards (PCB) located respectively inside the main body and the folder so that the signals are transmitted by the FPCB. The FPCB is normally disposed near the PCB and even around the antenna module, so the electrostatic discharge (ESD) and electromagnetic interference (EMI) problems arise accordingly.

In order to conquer the problem mentioned above, in a conventional pivoting apparatus of the foldable mobile phone, two metal plates are disposed on the two faces of the FPCB, and connected to the grounding area of the PCB located inside the folder by several contact pins.

However, metal plates are not only expensive but also lack of flexibility, which deteriorates the smooth movement when the folder is flipped. Besides, the size of metal plates is limited by the space of the pivoting apparatus small so that the FPCB is hardly well covered by the metal plates. Consequently, metal plates have a poor performance in shielding the FPCB, and the electrostatic discharge protection is also weak. Moreover, the grounding efficiency of the metal plate is limited to the contact pins. In conclusion, it lowers communication quality and causes permanent damage to the electronic device due to the problem of both electrostatic discharge and EMI.

SUMMARY OF THE INVENTION

It is therefore an object of the invention to provide a pivoting apparatus with a shielding function. The pivoting apparatus having a modified grounding surface completely receives the flexible printed circuit board (FPCB) in order to form a complete electromagnetic shielding. It eliminates the EMI problem and enhances electrostatic discharge protection.

The invention achieves one of the above-identified objects by providing a shielding apparatus of an FPCB. The apparatus is disclosed as below. The shielding apparatus includes a first metal sleeve and a second metal sleeve. The first metal sleeve disposed around to the FPCB is used for holding the first end of the FPCB, while the second metal sleeve disposed around the FPCB is used for holding the second end of the FPCB. The second metal sleeve and the first metal sleeve are rotatably connected for receiving the FPCB. When the first metal sleeve is rotated relatively to the second metal sleeve, the first metal sleeve twists the first end of the FPCB relatively to the second end of the FPCB.

The invention achieves another object by providing a pivoting apparatus with a shielding function. The apparatus is disclosed as below. The pivoting apparatus is used for rotatably connecting a main body and a folder of a foldable electronic device. In the foldable device, the main body has a first PCB, and the folder has a second PCB. The pivoting apparatus includes a flexible printed circuit board (FPCB), a first metal sleeve and a second metal sleeve. The FPCB having a first end and a second end is used for connecting the first PCB and the second PCB. The first metal sleeve is used for holding one part of the FPCB and fixing the first end of the FPCB on the main body. The second metal sleeve is used holding the other part of the FPCB and for fixing the second end of the FPCB on the folder. The second metal sleeve and first metal sleeve are rotatably connected for receiving the FPCB. When the folder is rotated relatively to the main body, the second metal sleeve twists the second end of the FPCB relatively to the first end of the FPCB.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
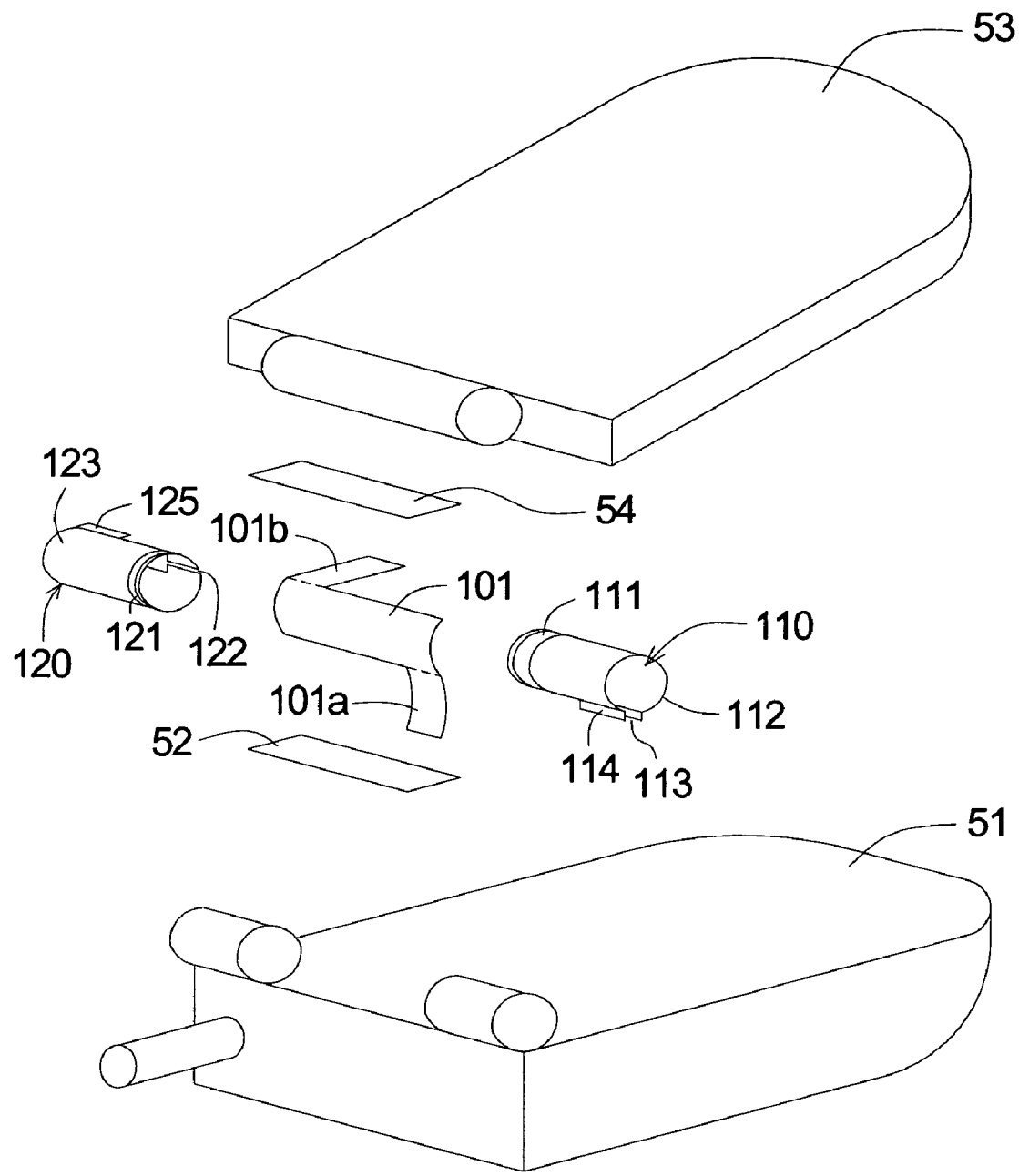
FIG. 1 schematically illustrates a perspective view a foldable electronic device having a pivoting apparatus with a shielding function according to a preferred embodiment of the invention.

Referring to FIG. 1, a perspective view of a foldable electronic device having a pivoting apparatus with a shielding function according to a preferred embodiment of the invention is shown. The foldable electronic device 50 includes a main body 51, a pivoting apparatus, and a folder 53. The foldable electronic device can be a foldable mobile phone, a notebook computer or a digital camera for instance. The main body 51 has a first printed circuit board (first PCB) 52, and the folder 53 has a second printed circuit board (second PCB) 54. The main body 51 and the folder 53 are rotatably connected by the pivoting apparatus with a shielding function. The pivoting apparatus includes a flexible printed circuit board (FPCB) 101 and a shielding apparatus of the FPCB. The shielding apparatus includes a first metal sleeve 110 and a second metal sleeve 120. The FPCB 101 having the first end 101a and the second end 101b is used for connecting the first PCB 52 and second PCB 54.

Figure 2A:
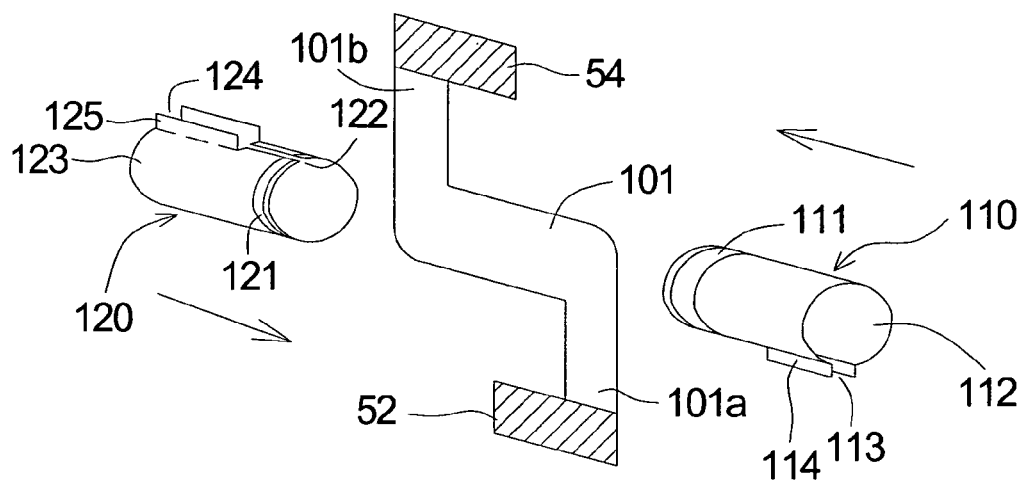
FIG. 2A is a schematic diagram of the pivoting apparatus with a shielding function before assembly.

Referring to FIG. 2A, it is a schematic diagram of the pivoting apparatus with a shielding function before assembly. In the pivoting apparatus, the first metal sleeve 110 includes an annular groove 111, and the second metal sleeve 120 includes a joint ring 121 having a gap 122. The pivoting apparatus is assembled according to the arrow directions.

Furthermore, the second metal sleeve 120 has a smaller thickness in order to maintain the flexibility of the sleeve, while the first metal sleeve 110 can also serve as the bearing between the main body 51 and the folder 53.

Figure 2B:
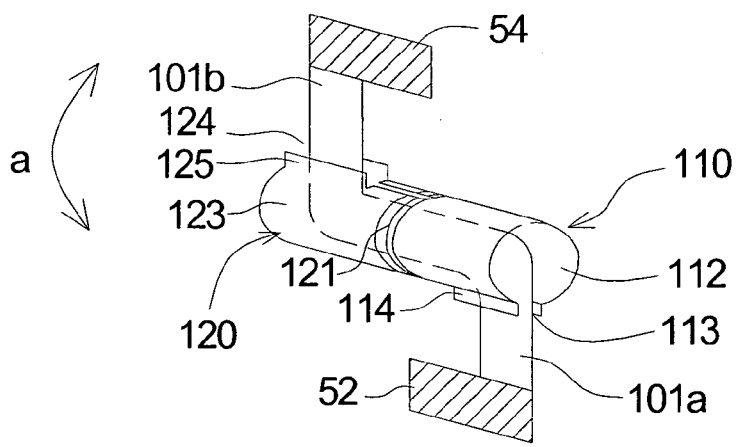
FIG. 2B is a schematic diagram of the pivoting apparatus with a shielding function after assembly.
Figure 2C:
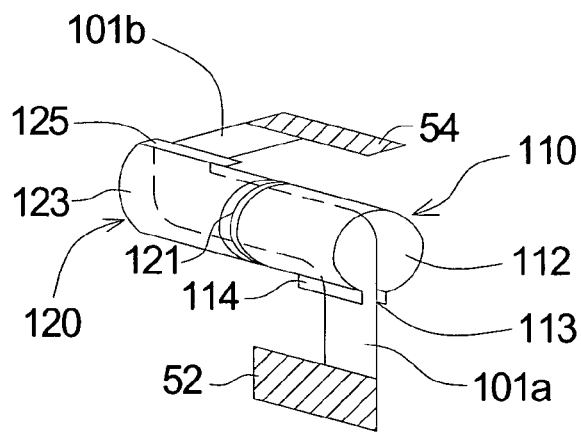
FIG. 2C is a schematic diagram of the pivoting apparatus with a shielding function after first metal sleeve and second metal sleeve are rotated relatively.

Referring to FIG. 2B, a schematic diagram of the pivoting apparatus with a shielding function after assembly is shown. During assembly, the joint ring 121 having the gap 122 is used for encircling or inserting into the first metal sleeve 110. Take FIG. 2B for example, after the joint ring 121 of the second metal sleeve is expanded, the joint ring 121 of the second metal sleeve 120 is cupped outside the first metal sleeve 110. The inner surface of the joint ring 121 contacts with a part of the outer surface of the first metal sleeve 110 on which the annular groove 111 is formed. Meanwhile, the annular groove 111 of the first metal sleeve 110 receives the joint ring 121 of the second metal sleeve 120. The outer surface of the joint ring 121 contacts with a part of the inner surface of the first metal sleeve 110 on which the annular groove 111 is formed. By means of the above design, the second metal sleeve 120 and the first metal sleeve 110 are rotatably connected to form a pivoting apparatus with a shielding function to completely receive the FPCB 101. After assembly, the first metal sleeve 110 can be rotated relatively to the second metal sleeve 120 along an arrow direction of the FIG. 2B. When the first metal sleeve 110 is rotated relatively to the second metal sleeve 120, the second metal sleeve 120 twists the second end of FPCB 101*b* relatively to the first end of FPCB 101*a* as shown in FIG. 2C.

The first metal sleeve further includes a first protruding plate for efficient grounding. As shown in FIG. 2A, the first metal sleeve 110 includes a first side wall 112, wherein the first side wall 112 has a first slit 113, through which the FPCB 101 is connected with the first PCB 52. Moreover, the first metal sleeve 110 further includes a first protruding plate 114 disposed on the first side wall 112, and the first protruding plate 114 and first side wall 112 form a non-circular structure. The first protruding plate 114 is preferably adjacent to the first slit 113, and the first slit 113 and the first side wall 112 are more preferably integrated as a whole. Besides, the first metal sleeve 110 is electrically connected to the grounding surface of the first PCB 52 through the first protruding plate 114 instead of pins, and the first protruding plate 114 has better conducting efficiency than conventional pins. Therefore the first protruding plate 114, when served as the charge-conducting medium between the first metal sleeve 110 and the grounding surface, can enhance the electrostatic discharge protection of the pivoting apparatus of the invention.

Figure 3:
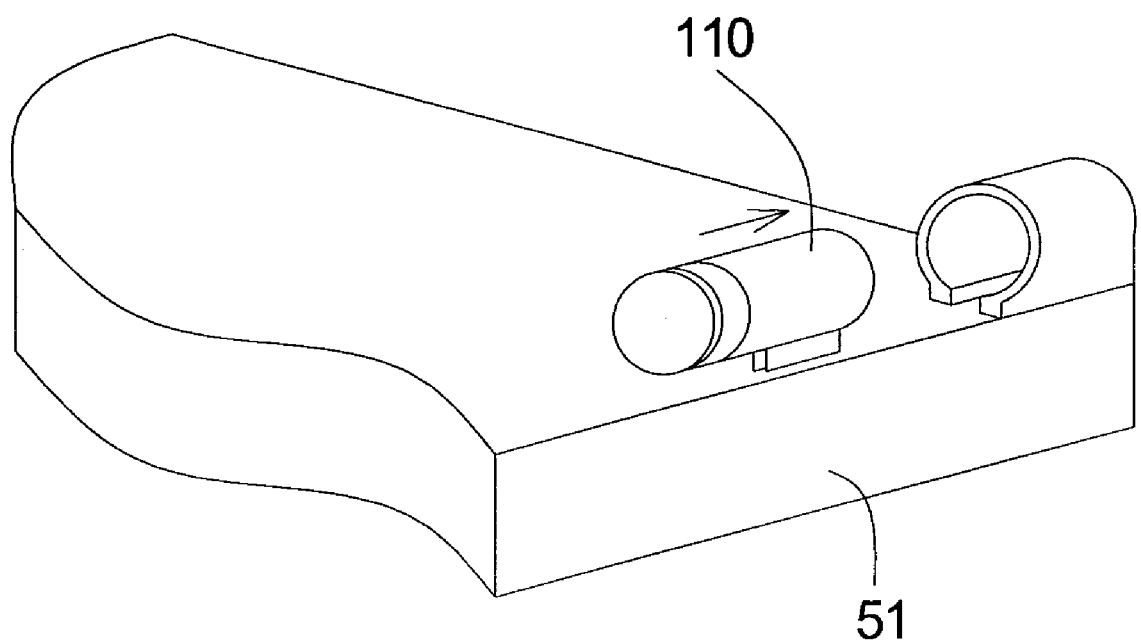
FIG. 3 is a partial enlargement view of the pivotal connection of a main body and a first metal sleeve of a foldable electronic device.

The first protruding plate of the first metal sleeve is also used as a fastener to fix the FPCB 101 on the main body. Please refer to both FIG. 2A and FIG. 3, a partial enlargement of the pivotal connection of a main body and a first metal sleeve of a foldable electronic device is shown. In FIG. 3, the main body 51 includes a protruding portion with a non-circular chamber, and the non-circular structure constituted by the first protruding plate 114 and the first side wall 112 is inserted into the non-circular chamber. This enables the first metal sleeve 110 to be firmly fixed to the main body 51. Therefore, when the first metal sleeve 110 is disposed around the FPCB 101, the first metal sleeve 110 can firmly fix the first end of FPCB 101*a* on the main body 51.

Similarly, the second metal sleeve further includes a second protruding plate for firmly connection and efficient grounding. As shown in FIG. 2A, a second metal sleeve 120 includes a second side wall 123, wherein the second side wall 123 has a second slit 124 through which the second end of FPCB 101*b* is connected with the second PCB 54. Moreover, the second metal sleeve 120 further includes a second protruding plate 125 disposed on the second side wall 123, and the second protruding plate 125 and second side wall 123 are formed a non-circular structure for firmly fixing the second metal sleeve 120 to the folder 53. Therefore, when the second metal sleeve is disposed around the FPCB 101, the second metal sleeve 120 can firmly fix the second end of FPCB 101*b* to the folder 53. Besides, the second protruding plate 125 is preferably adjacent to the second slit 124, and the second protruding plate 125 and the second side wall 123 are more preferably integrated as a whole. Since the second metal sleeve is electrically connected to the grounding surface of the second PCB 54 through the second protruding plate 125 instead of pins, and the second protruding plate 125 has better conducting efficiency than conventional pins. When used as a charge-conducting medium between the second metal sleeve 120 and the grounding surface, the second protruding plate 125 can enhance the electrostatic discharge protection of the pivoting apparatus of the invention.

By utilizing the first and second protruding plate 114 and 125, when the folder 53 is rotated relatively to the main body 51, the second metal sleeve 120 fixed to the folder 53 can twist the second end 101*b* of the FPCB 101 relatively to the first end 101*a* of the FPCB 101. In addition to that, the first protruding plate 114 and the second protruding plate 125 respectively connects the grounding surface of the first PCB 52 and the grounding surface of the second PCB 54. An enlarged grounding surface can enhance the electromagnetism shielding effect of the pivoting apparatus, reduce the EMI problem and enhance electrostatic discharge protection.

The pivoting apparatus with a shielding function disclosed in the above preferred embodiment of the invention has many advantages, including low cost, simple structure, strong electrostatic discharge (ESD) protection and good electromagnetic shielding effect. The embodiment of the invention offers both the pivot-connecting function and the electromagnetic shielding function, so that the foldable main body can be easily flipped and completely protected. The structure of the pivoting apparatus is simple so as to assemble easily. Moreover, the metal sleeve can completely receive the flexible printed circuit board (FPCB) and use metal plates with good conductivity to connect two grounding surfaces. It not only produces a better electromagnetic shielding effect to resolve the electromagnetic interference (EMI) problem, but also enhances electrostatic discharge protection. The shielding apparatus not only provides a complete protection to the FPCB, but further prevents interference between electric modules and FPCB of the electronic device. Besides, the metal sleeve of the pivoting apparatus is integrated as a whole so that the cost of manufacture is reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A pivoting apparatus with a shielding function for rotatably connecting a main body and a folder of a foldable electronic device, wherein the main body includes a first printed circuit board (first PCB), and the folder includes a second printed circuit board (second PCB), at least one of the first and second PCBs having a grounding surface, the pivoting apparatus comprises:
  a flexible printed circuit board (FPCB) for connecting the first PCB and the second PCB;
  a first metal sleeve for fixing a first end of the FPCB, the first metal sleeve being a curved metal plate and having two openings, the two openings being bounded by the curved metal plate and located at two opposite ends of the first metal sleeve, the first metal sleeve having an annular groove, a first inner surface, a first outer surface, a first sidewall, and a first protruding plate, the first protruding plate disposed on the first sidewall, the first sidewall having a first slit communicating with the two openings; and
  a second metal sleeve for fixing the second end of the FPCB, the second metal sleeve being a curved metal plate and having two openings, the two openings being bounded by the curved metal plate and located at two opposite ends of the second metal sleeve, the second metal sleeve comprising a second sidewall, a second protruding plate, and a joint ring having a gap, the second protruding plate being disposed on the second sidewall, the second sidewall having a second slit extended from the gap, the two openings communicating through the second slit and the gap, the joint ring having a second inner surface and a second outer surface, the joint ring being alterable in shape to allow the joint ring altered in diameter to enclose or insert into the annular groove, wherein the inner surface of the joint ring contacts with a part of the outer surface of the first metal sleeve on which the annular groove is formed, or the outer surface of the joint ring contacts with a part of the inner surface of the first metal sleeve on which the annular groove is formed, so as to allow the second metal sleeve and the first metal sleeve to be rotatably connected for receiving the FPCB;
  wherein at least one of the first and second protruding plates connects to the grounding surface, so as allow both first and second metal sleeves to be grounded when being rotatably connected to each other;
  whereby when the folder is rotated relatively to the main body, the second metal sleeve twists the second end of the FPCB relatively to the first end of the FPCB.

2. The pivoting apparatus according to claim 1, wherein the FPCB is passed through the first slit to be connected with the first PCB.

3. The pivoting apparatus according to claim 1, wherein the second end of the FPCB is passed through the second slit to be connected with the second PCB.

4. The pivoting apparatus according to claim 1, wherein the foldable electronic device is a mobile phone.

5. The pivoting apparatus according to claim 1, wherein the foldable electronic device is a notebook computer.

6. The pivoting apparatus according to claim 1, wherein the foldable electronic device is a digital camera.

7. The pivoting apparatus according to claim 1, wherein the second metal sleeve has smaller thickness than the first metal sleeve.

8. The pivoting apparatus according to claim 2, wherein the first protruding plate and the first side wall are formed a non-circular structure which enables the first metal sleeve to be fixed on the main body when the first metal sleeve rotates relatively to the main body.

9. The pivoting apparatus according to claim 3, wherein the second protruding plate and the second side wall are formed a non-circular structure which enables the second metal sleeve to be fixed on the folder when the second metal sleeve rotates relatively to the folder.

10. The pivoting apparatus according to claim 8, wherein the first protruding plate is adjacent to the first slit and formed monolithically with the first side wall.

11. The pivoting apparatus according to claim 9, wherein the second protruding plate is adjacent to the second slit and formed monolithically with the second side wall.

12. A foldable electronic device, comprising:
  a main body, including a first printed circuit board (first PCB) and a protruding portion with a non-circular chamber;
  a folder, including a second printed circuit board (second PCB); and
  a pivoting apparatus with a shielding function for rotatably connecting the main body and the folder, the pivoting apparatus comprising:
    a flexible printed circuit board (FPCB) for connecting the first PCB and the second PCB;
    a first metal sleeve being a curved metal plate and having two openings, the two openings being bounded by the curved metal plate and located at two opposite ends of the first metal sleeve, the first metal sleeve being disposed around the FPCB for holding a first end of the FPCB, the first metal sleeve comprising a first sidewall and a first protruding plate disposed thereon, the first sidewall having a first slit communicating with the two openings, the first protruding plate connecting to a grounding surface of the first PCB, the first protruding plate and the first side wall forming a non-circular structure and being inserted into the non-circular chamber, enabling the first metal sleeve to be fixed on the main body when the folder rotates relatively to the main body; and
    a second metal sleeve being a curved metal plate and having two openings, the two openings being bounded by the curved metal plate and located at two opposite ends of the second metal sleeve, the second metal sleeve comprising a second side wall having a second slit communicating the two openings, the second metal sleeve being disposed around the FPCB for holding the second end of the FPCB, wherein the second metal sleeve and the first metal sleeve are rotatably connected for receiving the FPCB;
  whereby when the folder is rotated relatively to the main body, the second metal sleeve twists the second end of the FPCB relatively to the first end of the FPCB.

13. The foldable electronic device according to claim 12, wherein the second metal sleeve comprises a joint ring having a gap, the joint ring is expandable in diameter for enclosing the first metal sleeve.

14. The foldable electronic device according to claim 12, wherein the FPCB is passed through the first slit to be connected with the first PCB.

15. The foldable electronic device according to claim 12, wherein the first protruding plate is adjacent to the first slit and formed monolithically with the first side wall.

16. The foldable electronic device according to claim 12, wherein the second end of the FPCB is passed through the second slit to be connected with the second PCB.

17. The foldable electronic device according to claim 12, wherein the foldable electronic device is a mobile phone.

18. The foldable electronic device according to claim 12, wherein the foldable electronic device is a notebook computer.

19. The foldable electronic device according to claim 12, wherein the foldable electronic device is a digital camera.

20. The foldable electronic device according to claim 13, wherein the first metal sleeve comprises an annular groove for receiving the joint ring.

21. The foldable electronic device according to claim 16, wherein the second metal sleeve further comprises a second protruding plate disposed on the second side wall, and the second protruding plate and the second side wall are formed a non-circular structure which enables the second metal sleeve to be fixed on the folder when the second metal sleeve rotates relatively to the folder.

22. The foldable electronic device according to claim 12, wherein the second protruding plate disposed along the second slit and formed monolithically with the second sidewall.

* * * * *